United States Patent [19]
Hedberg

[11] Patent Number: 5,939,896
[45] Date of Patent: Aug. 17, 1999

[54] COUPLING ARRANGEMENT IN A TERMINATING CIRCUIT

[75] Inventor: Mats Olof Joakim Hedberg, Haninge, Sweden

[73] Assignee: Telefonaktiebolaget LM Ericsson, Stockholm, Sweden

[21] Appl. No.: 08/836,714

[22] PCT Filed: Nov. 9, 1995

[86] PCT No.: PCT/SE95/01332

§ 371 Date: May 13, 1997

§ 102(e) Date: May 13, 1997

[87] PCT Pub. No.: WO96/16494

PCT Pub. Date: May 30, 1996

[30] Foreign Application Priority Data

Nov. 23, 1994 [SE] Sweden .................................. 9404065

[51] Int. Cl.[6] .............................................. H03K 19/0175
[52] U.S. Cl. ................................................ 326/30; 326/86
[58] Field of Search ................................. 326/30, 32, 33, 326/34, 56

[56] References Cited

U.S. PATENT DOCUMENTS

| | | | |
|---|---|---|---|
| 3,585,399 | 6/1971 | Andrews et al. | 326/30 |
| 4,228,369 | 10/1980 | Anantha et al. | 327/111 |
| 5,111,080 | 5/1992 | Mizukami et al. | 326/30 |
| 5,227,677 | 7/1993 | Furman | 326/30 |
| 5,374,861 | 12/1994 | Kubista | 326/30 |
| 5,457,406 | 10/1995 | Takada et al. | 326/30 |
| 5,585,741 | 12/1996 | Jordan | 326/30 |
| 5,644,254 | 7/1997 | Boudry | 326/30 |
| 5,684,411 | 11/1997 | Nepple | 623/33 |
| 5,689,655 | 11/1997 | Tanaka et al. | 326/30 |
| 5,726,582 | 3/1998 | Hedberg | 326/30 |
| 5,731,711 | 3/1998 | Gabara | 326/30 |
| 5,821,768 | 10/1998 | Rau | 326/30 |

FOREIGN PATENT DOCUMENTS 2-100507  4/1990  Japan.
WO 89/02201  3/1989  WIPO.

*Primary Examiner*—Jon Santamauro
*Assistant Examiner*—Don Phv Le
*Attorney, Agent, or Firm*—Burns, Doane, Swecker & Mathis, L.L.P.

[57] ABSTRACT

The invention includes a terminating circuit or network (4) which is connected to a signal transmission medium in the form of one or two conductors or lines (2, 3) on which information-carrying signals in the form of voltage pulses can be transmitted, and a impedance-matching circuit (4a) connected to the conductor or conductors. The circuit includes a mean voltage value forming unit which produces a mean voltage value, a control unit, which produces adapted reference voltage value, and an impedance-matching transistor which is included in said impedance-matching circuit, wherein said voltage value and said reference voltage value are added together to form a composite control voltage which is applied to the gate-connection of the impedance matching transistor.

44 Claims, 6 Drawing Sheets

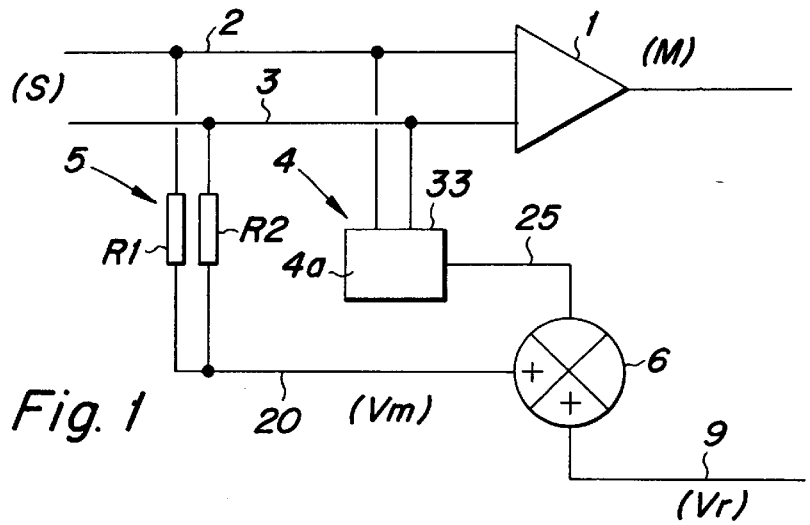
Fig. 1
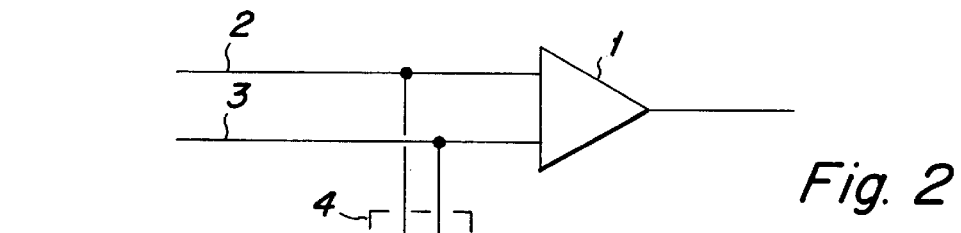
Fig. 2
Fig. 2a
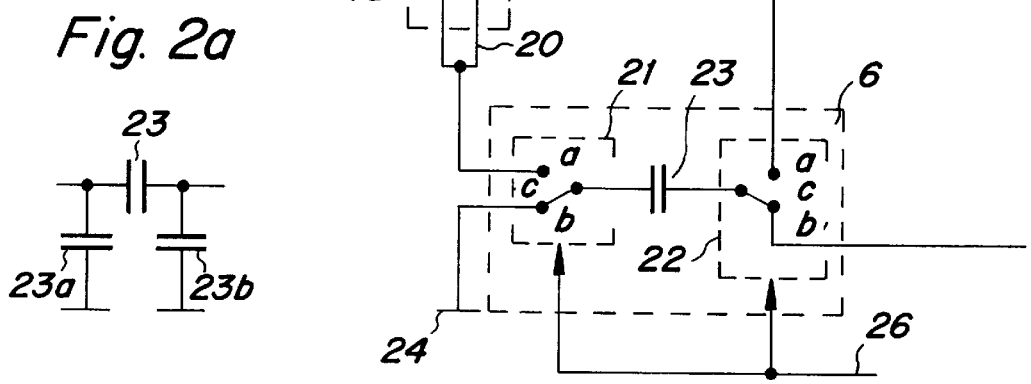
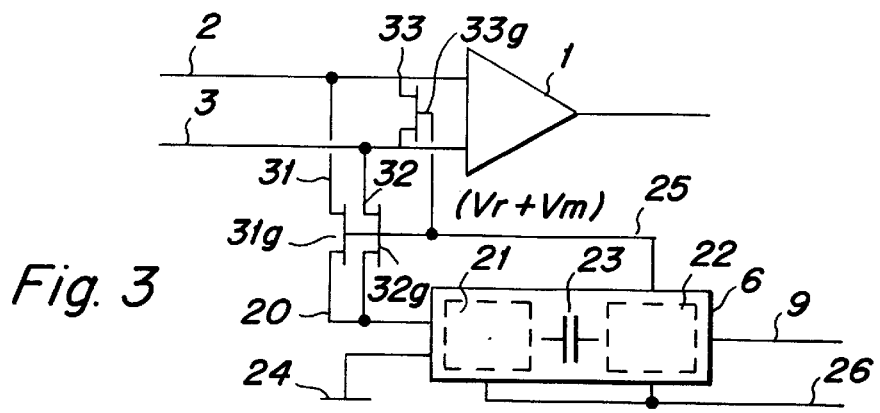
Fig. 3

COUPLING ARRANGEMENT IN A TERMINATING CIRCUIT

TECHNICAL FIELD

The present invention relates to a terminating circuit and then particularly, but not exclusively, to a terminating-circuit related coupling arrangement for achieving impedance matching which is controlled and chosen according to the application in question.

Systems for transmitting information-carrying signals over a signal transmission medium, such as physical conductors or lines, for instance, often require transmitter-related and/or receiver-related impedance matching, which impedance matching will preferably have at least one resistance-dominated impedance value adapted to the impedance of the signal Although the main application of the invention is found in a transmitter-related and/or a receiver-related impedance-matching terminating-circuit related coupling arrangement, it is thought that the most frequent application will be one in which the coupling arrangement is coupled upstream of a signal-receiving and signal-processing unit.

Consequently, the following description is simplified to include only this latter application of the invention, and the person skilled in this art will be well aware of the conditions and prerequisites required to implement the inventive coupling arrangement in a signal-transmitting unit, particularly on the basis of the teachings provided in the following description.

Thus, the present invention pertains to a terminating-circuit related coupling arrangement which, related to the signal transmission medium, may be coupled upstream of a signal-receiver and signal-processing unit, said unit being connected to a single transmission medium conductor and to a reference potential in the case of "single-ended" signalling, and to two transmission medium conductors in the case of "differential" signalling.

As the person skilled in this art will be aware, the difference between single-ended signalling and differential signalling is that in the former case an information-carrying signal occurs as voltage pulses on one conductor and in the latter case as voltage pulses between two conductors which are counter-directed so that when a high voltage pulse occurs on one conductor a low voltage pulse will occur on the other conductor, and vice versa.

The invention has been devised for inclusion in a signal-transmission system, and then particularly in a system for transmitting a digital information-related signal structure. In such systems, it is desired to be able to balance-out a transmitter impedance and/or a receiver impedance which exhibits pronounced resistive properties against the impedance value of the signal-transmitting medium, so as to improve signal transmission quality and to reduce otherwise occurring signal reflections at the ends of the transmission medium.

The terminating-circuit related coupling arrangement adapted for a signal-receiving and signal-processing unit in accordance with the invention is particularly suitable for application in a differential signalling system, in which oppositely directed voltage values on the conductors alternate between two chosen signal voltage levels, a low voltage level and a high voltage level.

The inventive coupling arrangement is also adapted to enable it to be incorporated in an integrated circuit and it shall be possible to form the chosen circuit solution via a selected conductor pattern for using metal layers, applied to a selected base matrix (base bar) so as to form a circuit macro, such as an I/O macro (input and output circuits for the integrated circuit).

It is considered particularly beneficial to construct the inventive coupling arrangement so that it can be implemented by using a standardized basic chip having a centrally orientated gate ocean with the input and outputs that belong to the coupling devices including PMOS transistors and NMOS transistors, among other things.

When such a basic chip is provided with a chosen number of metal layers, via which layers the requisite coupling arrangement is formed, there is constructed a gate matrix having functionally complete I/O circuits or like edge-orientated circuits.

Also provided are edge-orientated bond pads for connection, e.g. bonding, to components of the gate matrix or to external components, such as resistors, conductors and the like, either directly or through the medium of a capsule.

Normally, an input circuit (I-circuit) is allocated one bonding or connecting island and an output circuit (O-circuit) is allocated one bonding or connecting island. Although one bonding island is sufficient for single-ended signalling, two bonding islands are required for each circuit in the case of differential signalling.

DESCRIPTION OF THE BACKGROUND ART

Several different designs of terminating-circuit related coupling arrangements intended for the above application are known to the art, as are also different circuit solutions.

Thus, it is known to connect resistive elements (resistances) whose allocated resistance values correspond to an impedance value, nominally 50 ohms, allocated to a used conductor or to a used transmission medium, between conductor and earth potential or some other reference.

With regard to the application with which the invention is associated, it is known that NMOS transistors and PMOS transistors can be controlled with a gate voltage whose value is such that the drain-source path of the transistor will exhibit a pronounced resistive property, a property which is utilized by the inventive terminating-circuit related coupling arrangement.

It is also known to use NMOS transistors and PMOS transistors in providing for necessary circuit solutions for the signal-transmitting and/or the signal-receiving unit where these are structured within the I/O circuits for the integrated circuits used.

It is also known to choose the circuit solutions for the signal-transmitting and/or signal-receiving units used so that said units will be able to transmit and receive information-carrying signal pulses which have a signal structure in which the bit rate can reach to the GHz range.

When the circuit couplings or switches used are comprised of NMOS transistors and/or PMOS transistors and components that are formed in the basic chip and/or discrete components, it is also known that the properties of these circuit couplings will be highly dependent on the instantaneous system voltage level and that these properties are influenced markedly by variations in this voltage level.

It is also known that the properties of these circuit couplings are temperature-dependent.

SUMMARY OF THE INVENTION

TECHNICAL PROBLEMS

When considering the earlier standpoint of techniques as described above, it will be seen that a technical problem is one of providing a terminating-circuit related coupling arrangement which, formed in a gate matrix, can utilize available transistors and provide good matching to the impedance value of the transmission medium, essentially independently of changed properties of remaining circuit couplings, such as those that are influenced by system voltage variations, temperature variations and the like.

Another technical problem in the case of terminating-circuit related coupling arrangements of this kind is one of providing both dynamic and static compensation for the influence of changed properties that will be effective in practice.

Another technical problem associated with such coupling arrangements and such applications within integrated circuits is one of providing an active and floating terminating circuit with automatic compensation to a chosen nominal value when properties change.

Another technical problem is one of realizing the conditions that are required to obtain automatic compensation via voltage matching to the gate connection of a transistor used in the coupling arrangement, and therewith change the working point of the transistor, both dynamically and statically.

Another technical problem is one of realizing that requisite voltage matching requires access to a reference voltage and a mean voltage value formed by the signal structure of the pulses for requisite information transmission.

A further technical problem is one of realizing the measures that need to be taken in order to readily obtain access to the voltage levels which when added would provide requisite matching of the impedance value to a nominal value and which shall be delivered to the transistor gate-connection functioning as a terminating load.

It is, besides this, a technical problem to provide the conditions required to form a terminating-circuit related coupling arrangement of this kind through simple coupling technical means with the basis of a standardized gate matrix.

Another technical problem is one of realizing the significance of using as a gate voltage of a transistor which serves as a terminating load a variable reference voltage which is generated externally of the circuit and which functions as a control voltage, wherein the value of the reference voltage is made dependent on current temperature and independent of variations in the value of the static supply voltage and momentary slow changes in the supply voltage, etc., and allowing the reference voltage added to a mean voltage value generated externally of the circuit to act on the gate connection of the transistor (the transistors) included in the terminating circuit so as to be able to control and adapt the resistance-dominating value of the terminating impedance to a circuit-related nominal value.

It will also be seen that a technical problem resides in providing an impedance matching net or circuit which can be connected to a signal-receiving circuit that has a wide working range, therewith enabling the terminating network-related coupling arrangement to provide impedance matching to a nominal impedance value even when the mean level of the information-carrying signal varies widely, and to enable reception of information-carrying signals.

Another technical problem is one of realizing the conditions that are required in order to provide compensation for transistor-related "body-effects".

In this regard, a technical problem resides in the ability to realize that this compensation can be achieved by amplifying solely said mean value voltage and adding said voltage to the reference voltage prior to delivering this composite voltage to the gate connection.

Another technical problem is one of being able to create with the transistors and/or the components available in I/O macro circuits conditions for applying inter alia the mean voltage value to the gate connection via an SC-technique (Switch Capacitor technique).

Another technical problem is one of creating through the medium of SC technology conditions which will enable voltage from which the mean value is formed voltage to be given a value which is amplified in relation to the mean value and which is adapted to compensate for the drop in voltage caused by parasitic capacitances and the voltage increase required to compensate for the "body-effect".

It will also be seen that a technical problem is one of achieving such compensation and dynamic matching by virtue of a controllable voltage value of the gate connection of a transistor associated with the impedance network in respect of transistor which influences the terminating impedance being able to create an active terminating impedance, and to observe that said transistor has capacitive properties, and therewith to utilize these properties so as to enable the gate-related voltage value to be stored directly in one or more of the transistors that exhibit terminating impedance and that belong to the terminating circuit.

Another technical problem is one of creating via transistor control a terminating impedance value which is stable and at least essentially independent of voltage changes in the system voltage and which can be controlled by temperature variations, and also in realizing that there is required-in this regard effective disturbance insulation from other circuits, which can be implemented by filtering the reference signal through a lowpass filter in the close location of the terminating circuit.

Another technical problem is one of being able to create a terminating-circuit related coupling arrangement of simple and robust construction which is able to operate with SC technology while using transistor couplings and/or component couplings in the I/O surfaces of the IC circuits used.

It will also be seen that a technical problem is one of realizing the significance of creating conditions such that the SC-technique applied will be operated directly by an incoming data stream, meaning that the I/O macro circuit need not be controlled by separately generated clock pulses.

It will also be seen that a further technical problem is one of realizing the conditions for and the necessity of adapting utilized analog amplifier couplings and/or the SC-technique so as to be able to vary a controlled gate voltage for utilized transistor-containing terminating circuits even extending an own supply voltage.

Another technical problem is one of realizing the conditions for and the significance of incorporating such an SC-technique with simple means in an existing gate array structure (GA structure) with only slightly impaired properties with regard to the accuracy of the terminating impedance with varying terminating potentials and/or signal mean values.

Another technical problem is one of providing a terminating-circuit related coupling arrangement of the aforesaid kind which is not only of simple construction but also power lean.

Another technical problem is one of providing a terminating circuit which can be used in a signal-receiving unit and which offers a wide working range, where a utilized actively matchable transistor-allocated terminating circuit is able to operate independently of the construction of the transmitter and/or receiver, and therewith enable the transmitter and/or the receiver to respond to signal variations from slightly below 0-level and up to slightly more than half the supply voltage, with the aid of NMOS-transistors.

It will also be seen that a technical problem resides in realizing that a wide working range of the aforesaid nature enables one and the same NMOS-transistor loaded terminating circuit to be used to terminate information-carrying signalling systems that have different CM-regions for the signal-receiving circuit.

Another technical problem is one of realizing the conditions required to obtain an accurate transistor-allocated terminating circuit, where practical tests indicate that a tolerance better than ±5% within a relatively wide working range lies within the scope of these possibilities.

It will also be seen that a further technical problem is one of providing a receiver-related terminating circuit which can be made floating, deactivated from or connected to a fixed voltage while nevertheless providing active matching requisite herefor.

Another technical problem is one of realizing the measures that are required to create conditions such that when a signal-receiving unit is structured with NMOS-elements, a matching reference voltage generating circuit will also be structured with NMOS-elements, and that when the terminating circuit uses NMOS-elements, the signal-receiving unit will be able to cover a voltage-wise related "lower window", ranging from slightly above half the supply voltage to slightly beneath 0-level.

It will also be seen that a problem resides in realizing those measures that are required to create conditions such that when the signal-receiving unit is structured with PMOS-elements, a matching reference voltage-generating circuit will also be structured with PMOS-elements and that when the terminating circuit uses PMOS-elements, the signal-receiving unit will be able to cover a voltage-wise related "upper window", ranging from slightly beneath half the voltage supply to slightly above the supply voltage.

Still another technical problem resides in the ability to create conditions such that a terminating-circuit related coupling arrangement structured, inter alia, from NMOS-elements and PMOS-elements will be capable of being connected to said lines or conductors and to activate a selected coupling arrangement and deactivate the other coupling arrangement with the aid of an externally generated activating signal, so that one and the same terminated transmitter-loaded or receiver-loaded I/O circuit is able to selectively cover a selected part of the supply window through the medium of said activating signal.

In addition, it will be seen that a technical problem resides in the ability of creating with the aid of simple means conditions whereby a matched transistor-loaded terminating circuit can be deactivated, either completely or partially, by means of a selected control voltage value (goes to zero), i.e. can be switched to a state of high impedance, and therewith create conditions for deactivating, or disabling, the terminating circuit in bus and transceiver applications.

Another technical problem is one of realizing the advantages associated with the fact that termination is most ideal at low signal levels.

SOLUTION

With the intention of solving one or more of the aforesaid technical problems, the present invention takes as its starting point a terminating-circuit related coupling arrangement which is adapted to be connected upstream of a signal-receiving and signal-processing unit connected to a transmission medium, such as one or two lines or conductors on which information-carrying signals in the form of voltage pulses can be transmitted.

In accordance with the present invention, a transistor which has the impedance of the terminating circuit and which is included in the coupling arrangement has applied to its gate connection a composite voltage value, through the medium of a unit which forms the voltage mean value of the information-carrying signals and a controlled reference voltage value generated by a control unit, these voltage values being added together to form said composite voltage value.

In accordance with proposed embodiments that lie within the scope of the inventive concept, the voltage value applied to said gate connection consists in a pure addition of a voltage value from the voltage mean-value forming unit and a reference voltage level generated by a control unit or control circuit.

The voltage value applied to the gate connection will preferably be slightly raised so as to compensate for transistor-related body-effects, among other things.

According to the invention, the voltage mean-value forming unit is comprised of an impedance matched component which is connected to said transmission medium, i.e. its conductors, which is also connected to represent a mean value formed by occurrent voltage pulses.

According to one embodiment of the invention, the formed mean voltage value is applied to a switching circuit which in a first state applies said voltage to said gate connection via a capacitor and a further switching circuit belonging to the first-mentioned circuit, and in a second state releases said voltage and said gate connection and connects an earth-potential related reference level with the control voltage generated by said control unit via the capacitor in said circuit.

It is also proposed that the reference voltage is chosen beneath a selected system-related supply voltage.

It also proposed that the unit which forms the mean voltage value is comprised of two series-connected transistors in the terminating circuit connected between said two conductors or lines, the common junction point of these transistors being connected to a conductor so as to form a mean value voltage.

It is also proposed that the two gate connections of the series-connected transistors are mutually connected with a gate connection of a further transistor connected between the conductors.

In accordance with one embodiment of the invention, compensation for a shift in the working point of a transistor or a shift in a terminating point relative to earth potential is achieved by adapting the level of the voltage occurring on the gate connection or on the substrate gate of the transistors included in the terminating circuit.

The invention enables this compensation to be made dynamic, to the extent that impedance matching will take place even in the case of mean level changes in signals that are faster than the changes that the control and addition circuits are capable of following.

It is also possible in accordance with the invention for the voltage on the gate connection to be made higher than the own voltage supply, through the medium of an SC-technique.

In addition, the invention enables a terminating-circuit related coupling arrangement to be completely floating, deactivated or related to a fixed voltage.

The invention also enables the creation of conditions for selectively covering lower and upper windows allocated to the transmitter and/or receiver, by choosing NMOS- and PMOS-transistors for different terminating circuits.

The invention also provides the possibility of switching the transistors belonging to the terminating circuit to a state of high impedance in response to an externally generated activating signal.

The invention also proposes the use in the SC-technique of a further capacitor which can be connected to the aforesaid capacitors and which is capable of being activated and deactivated by switching circuits such as to raise the voltage value to be applied to the gate connections above the voltage value of the control signal.

In this regard, the formed mean voltage value is applied to a further switch so that in one state of the switch said voltage value can be caused to build-up the potential in the further capacitor.

In accordance with one embodiment of the invention, the further capacitor is connected to earth potential when said further switch is in a second state.

ADVANTAGES

Those advantages primarily characteristic of an inventive terminating-circuit related coupling arrangement adapted, among other things, to a signal-receiving and signal processing unit in accordance with the present invention reside in the creation of conditions for constructing an active transistor-related terminating circuit having automatic compensation of the working point of an impedance-determining terminating transistor, by creating through the medium of a mean-voltage forming unit a voltage value which can be applied to the gate connection or connections of the terminating transistor or transistors, either directly or when added to a reference voltage generated by a control circuit, and therewith cause the resistance-dominating impedance value of the terminating transistor to change to a selected nominal terminating value, essentially independently of the terminating voltage.

The main characteristic features of an inventive terminating-circuit related coupling arrangement are set forth in the characterizing clause of the following claim 1.

BRIEF DESCRIPTION OF THE DRAWINGS

The invention will now be described in more detail with reference to embodiments that are at present preferred and that have features significant of the present invention, and also with reference to the accompanying drawings, in which FIG. 1 is a schematic illustration of the principle construction of a terminating-circuit related coupling arrangement which is connected upstream of a signal-receiving and signal-processing unit in accordance with the invention, and also shows the addition of two voltage values, i.e. a voltage value representative of a reference signal and a voltage value formed by a mean value generated by a signal structure;

FIG. 2 is a circuit diagram illustrating a second embodiment which, with SC-technique, forms a circuit arrangement according to FIG. 1, although with the difference that the mean-value forming unit and the terminating circuit are integrated;

FIG. 3 is a circuit diagram illustrating a third embodiment of a circuit arrangement according to FIGS. 1 and 2 with regard to the mean-value forming unit and the terminating circuit;

DESCRIPTION OF EMBODIMENTS AT PRESENT PREFERRED

Figure 4:
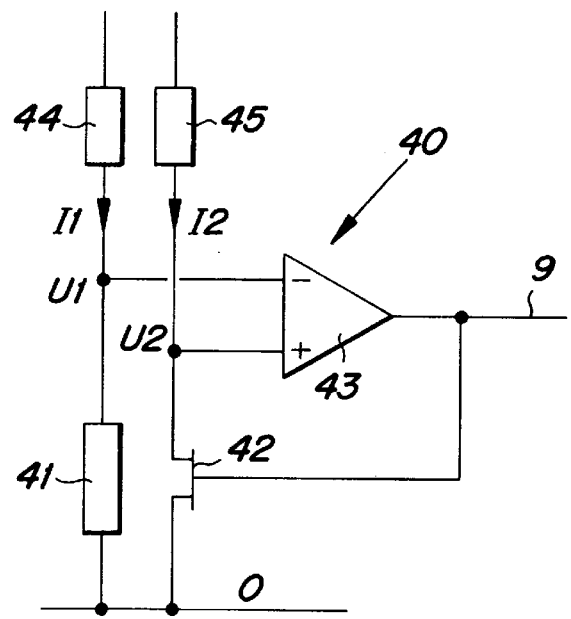
FIG. 4 illustrates in principle an embodiment of a control unit which functions, among other things, to generate a temperature-compensation control voltage value and a voltage value (reference voltage) which is kept constant when the supply voltage varies.

FIG. 1 thus illustrates a terminating-circuit related coupling arrangement which is connected upstream of a signal-receiving M and signal-processing unit 1.

In the illustrated differential signal transmission system, both a terminating circuit or network 4 and a receiver 1 are connected to two lines or conductors 2, 3, which are included in a signal transmission medium and are capable of transmitting information-carrying signals in the form of voltage pulses.

FIG. 1 is intended to illustrate that an impedance-matching circuit 4a belonging to the terminating circuit or network is connected directly to the two conductors 2, 3 and is adapted to exhibit a resistance-dominated impedance value (say 50 ohms), which corresponds to an impedance value of the transmission medium (the conductors 2, 3) on which the information-carrying signals are transmitted.

Although not shown in detail, the conductors 2, 3 are connected to a signal transmission circuit S in a known manner.

Under ideal conditions, which are assumed to prevail in the following description, the output impedance of the transmitter (S) shall be allocated a value which corresponds to the impedance value of the transmission medium (2, 3), and an input impedance value allocated to the receiver (M).

The impedance values of the transmitter (S) and the receiver (M) are resistance-dominating values and it is assumed in the following that these values can be controlled so as to be. kept constant among other things, irrespective of temperature variations, process parameters, etc.

It is assumed in the following description that the chosen nominal value is 50 ohms.

Signal-transmission circuits and signal-receiving circuits and signal-processing circuits are known to the art and will not therefore be described in detail here.

However, it can be mentioned that in one application according to the invention, these circuits are normally formed with the aid of a plurality of transistor couplings included in available transistors within the I/O macro range of an IC circuit.

The illustrated inventive terminating-circuit related coupling arrangement shall also use transistors, etc., available within the I/O macro range.

FIG. 1 also illustrates a mean-voltage forming circuit 5, such as to obtain on a line or conductor 20 a voltage value (Vm) which is represented by the mean value of those voltage pulses that are generated by the information-carrying signals generate over the conductors 2, 3. The voltage value Vm is thus purely a mean value-formed voltage value.

In the case of differential signalling, the signal voltages will be stable, and with signal structures alternating between 0 and 1 the mean value will be an exact mean value at different high resistance values in the circuit coupling 5.

However, the invention pertains to the evaluation and use of the mean value given by momentary variations in signal voltage, and it is assumed in the following that the mean value will not be changed as a result of the signal structure caused by variations in transmitted pulse sequences at relevant voltage levels.

In the case of single-ended signalling, it can be expected that the signal structure caused by transmitted pulse sequences is able to influence the formation of a mean value more pronouncedly. In this case, the formation of a mean value is evaluated via integrating-circuits or via lowpass filtration.

In the following description of differential signalling, it is assumed that the mean value formed has the value of 0.5 V.

The aforesaid mean-value forming voltage value (Vm) is now added through the medium of a voltage addition circuit 6 to a reference voltage (Vr) generated by a control-voltage generating a control unit (see FIG. 4), and the composite voltage formed by adding said voltages together functions as a control voltage and shall occur on a conductor 25 and therewith steer the circuit 4a of the terminating network to present a terminating impedance, which is regulated to a nominal value of 50 ohms, for instance.

It will be clearly seen from FIG. 1 that the circuit 4a is influenced by the momentary voltage value (Vm) from the mean-value forming circuit 5 and by the momentary reference voltage value (Vr) from the control unit, via a conductor 9.

It is assumed in FIG. 1 that the mean-value forming circuit 5 comprises two resistive elements (the resistors R1, R2) which have relatively high and mutually the same resistance values, wherein activation of the elements will have only an insignificant affect on the impedance matching affect on the terminating circuit 4a.

It is possible within the scope of the invention to combine the mean-value forming circuit 5 with the circuit 4a that has the terminating impedance, wherein the circuit 4a of the FIG. 3 embodiment is assumed to consist of transistors.

The impedance value of the impedance-value forming or exhibiting circuit shall be kept constant in relation to a nominal value as far as possible, and it is therefore necessary to adjust this value in response to variations in temperature but independent of voltage variations, process dispersion or deviation, etc.

The invention is thus based on adding together two voltage values, each of which is variable, i.e. a reference voltage value which, among other things, increases with increasing temperatures, and a mean voltage value which is dependent on the prevailing signal structure and voltage levels.

The value of the reference voltage is slowly variable in time, whereas the voltage value forming the mean value varies rapidly in time.

Figure 14:
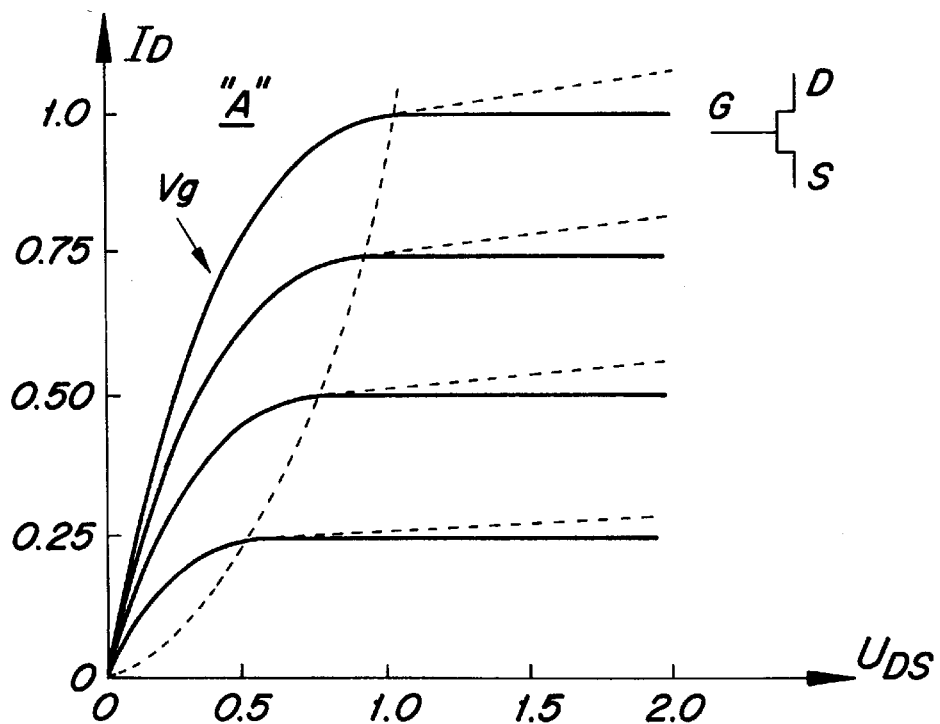
FIG. 14 shows graphs relating to NMOS-transistor characteristics.

The composite voltage thus formed by said addition is applied to the gate connection of a transistor which determines the terminating impedance and whose characteristic graph is shown in FIG. 14.

The gate voltage Vg and other parameters shall be chosen essentially within the proportional or linear area A.

FIG. 3 illustrates a coupling arrangement where the gate voltage Vg is a direct sum of the two added voltage values (Vr+Vm).

As will be seen more clearly from FIG. 2, a mean value can be formed from the signal voltage variations on the conductors 2 and 3, through the medium of a terminating-circuit related element 4a, this mean value occurring as a voltage and being referred to in the following as the mean-value formed voltage value 20 (Vm).

FIG. 2 also illustrates the use of SC-technology and shows a first switching circuit or a first switching device 21, a second switching device 22, and a capacitance-dominated device, such as a capacitor 23, connected between the two switching devices.

In the illustrated practical application, the circuits or switching devices 21 and 22, and also the capacitor 23 may comprise controllable transistor couplings, which are known to the art and need not therefore be described.

All of the illustrated switching circuits or switching devices 21 and 22 can be brought selectively to one of three states a, b and c, as shown in the Figure, wherein the switch state c is intended to illustrate an open position.

The electrical contact position 21a of the switching device 21 is in relation to the voltage value 20 (Vm), whereas the electrical contact position 21b is earth-related 24.

The electrical contact position 22b of the switching device 22 is related to the reference voltage (Vr), whereas the electrical contact position 22a is related or connected to a conductor 25 which is connected to a gate connection of the transistor or transistors exhibiting the terminating impedance.

The electrical contacts 21 and 22 are mutually coupled through the capacitor 23.

As one among several embodiments, the voltage adding circuit 6 indicated in FIG. 1 may comprise said switching devices 21 and 22 and the capacitor 23.

The capacitors 23a, 23b shown separately on the left in FIG. 2 are solely intended for illustrating parasitic capacitors and are not included in the following description, although it must be said that occurring voltages must be increased in order to compensate for the effect of the parasitic capacitors.

When the switching device 21 is in state 21b and the switching device 22 is in state 22b, as shown in FIG. 2, the capacitor 23 is charged with a voltage that corresponds to the reference voltage (Vr) on the line or conductor 9.

When the switching device 21 is in state 21a and the switching device 22 is in state 22a, there occurs on the conductor or line 25 a voltage which corresponds to the voltage to which the capacitor 23 was earlier charged, sign-added with the voltage (Vm), represented by the mean-value formed reference voltage 20.

The circuits 21 and 22 can be set to a desired position or state by means of a signal on a conductor 26.

This activating signal is generated in a circuit (not shown) and controlled by a control means, also not shown.

FIG. 3 illustrates an embodiment in which the terminating circuit or network 4 is comprised of three terminating impedances, including a first transistor 31, a second transistor 32, and a third transistor 33. In the illustrated case, the transistors 31 and 32 are assumed to be series-connected over the conductors 2 and 3 and function as a mean-value forming circuit for generating a voltage 20.

An impedance matching value is formed from two series-connected transistors 31 and 32 parallel connected by a further transistor 23.

This enables the different impedance values of the transistors 31, 32 and 33 to be selected, although so that in total a medium-matched value is obtained, for instance a value of 50 ohms.

In forming a mean value, mutually the same impedance value will be chosen with regard to the transistors 31 and 32.

The impedance value chosen in respect of the transistors 31 and 32 may be much higher than the impedance value of the transistor 33.

One or more of these transistors may be replaced with a fixed resistance value (a resistor) and therewith allow only the others to be adjustable.

In particular, the transistors 31 and 32 may be replaced with purely resistive elements, preferably high-ohmic resistances and impedance-matching adjustment allowed to take place solely via the transistor 33.

Other circuit couplings, such as a fixed resistance parallel-coupled with a transistor, a fixed resistance series-coupled with a transistor, and combinations thereof, may also be used.

However, the FIG. 3 embodiment is a coupling arrangement in which the gate connections 31g, 32g of the transistors 31 and 32 are connected to the gate connection 33g of the transistor 33 and all are controlled by the voltage on the conductor 25.

It is assumed that all transistors 31, 32 and 33 are driven via the gate connections with voltage values adapted so as to exhibit resistance-dominating properties.

The parasitic capacitances (23a, 23b) are not shown in FIG. 3, although the circuit 6 may be configured in the same way as that-shown in FIG. 2.

FIG. 4 illustrates diagrammatically a control circuit 40 which is able to form an adjusted reference-related voltage value on the conductor or line 9.

The circuit 40 is comprised of an operational amplifier 43 whose two inputs are connected to two parallel electric circuits (I1, I2).

An electric circuit I1 has an external fixed reference resistance 41 and an electric circuit I2 has an internally adjustable resistance-dominated transistor 42.

The circuit 40 is intended to deliver a controllable reference voltage, i.e. a slowly variable control voltage, which is intended to control instantaneous resistance values or impedance values for impedance matching or input-resistance matching, included in a single transmission circuit, in a signal-receiving circuit, or in other circuits or connections.

It will be noted, however, that the circuit 40 is adapted to be able to maintain the controllable voltage on the conductor 9 constant, among other things irrespective of variations in the system voltage, although the controllable voltage may also increase with increasing temperature and vice versa.

The reference voltage can thus be controlled so as to maintain the value constant, with a value chosen in accordance with a chosen impedance value and in accordance with parameter variations caused by process dispersion or deviation.

Normally, the control circuit 40 will be located so close to the controlled impedance or terminating circuits as to allow it to be assumed in practice that one and the same temperature will prevail within both of these areas.

The circuits illustrated in FIGS. 2 and 3 thus provide a transistor-related, working-point shift and a terminating-point shift in relation to earth potential.

The coupling arrangement illustrated in FIGS. 2 and 3 is based on SC-technology and, in this regard, provides dynamic compensation, insomuch that a control value applied, inter alia, to the gate connection 33g can be stored directly through the medium of a transistor which functions as a terminating impedance, insomuch that said transistor also has capacitive properties and can therewith store an applied voltage.

Figure 5:
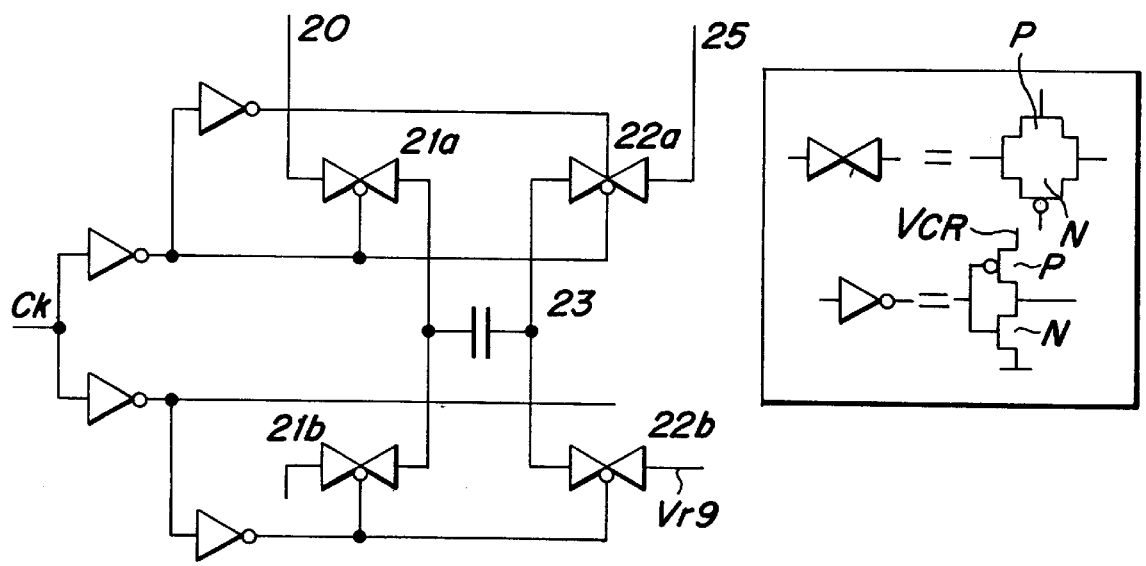
FIG. 5 illustrates a more detailed coupling circuit forming part of an inventive embodiment according to FIG. 3.

FIG. 5 illustrates a circuit layer in somewhat more detail, wherein the circuits 21 and 22 and the capacitor 23 are drawn similarly to the circuits that shall create the electrical contact functions 21a, 22a; 21b and 22b.

Figure 6:
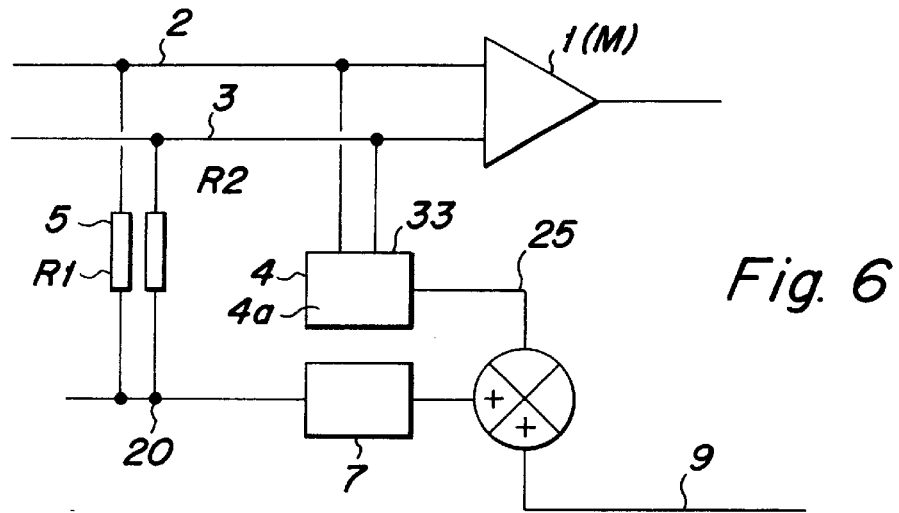
FIG. 6 illustrates schematically the principle construction of a terminating-circuit related coupling arrangement, similar to the embodiment of FIG. 1 but with analog amplification of the mean voltage value formed by the signal structure, to make compensation for the body-effect, among other things, possible.

FIG. 6 is intended to illustrate a coupling arrangement in which the mean-value formed voltage value 20 is amplified in an amplifier 7, prior to being added to the reference voltage.

The voltage increase (Vr+kVm) thus obtained on the conductor or line 25 can be used to compensate for the effect of the parasitic capacitance and for transistor-related body-effects.

The SC-technology applied includes, among other things, the first switching circuit 21, the capacitor 23 and the second switching circuit 22, and enables the voltage applied to the gate connection 33g, through the medium of further switching means (see FIG. 7) to be higher than its supply voltage.

In accordance with the present invention, the voltage applied to the gate connection may be allowed to vary from being slightly beneath 0-level to being slightly above half the supply voltage, defined as a "lower window", via NMOS-transistors.

PMOS-elements including a PMOS-matched reference generator (40) may be used as terminating functioning transistors.

When using PMOS-elements, the voltage applied to the gate connections may be allowed to vary from being slightly beneath half the supply voltage to being slightly above the supply voltage, so as to form an "upper window".

Figure 16:
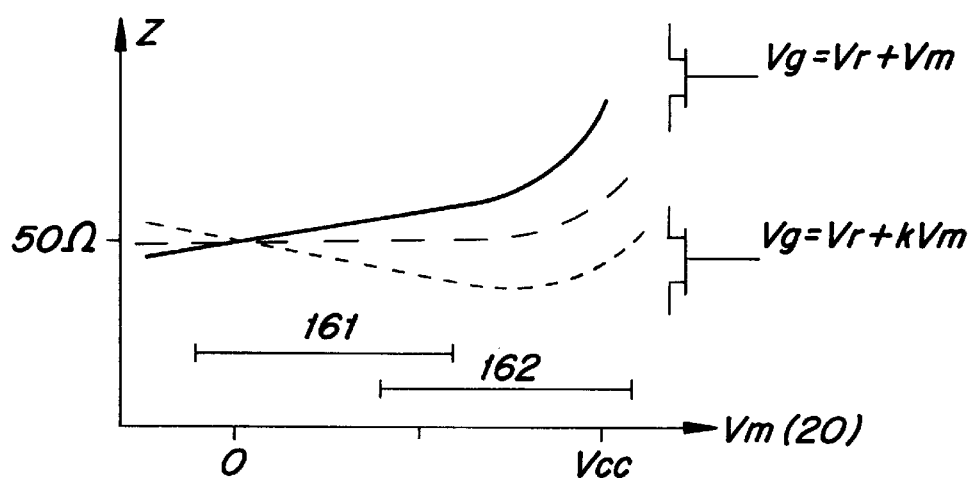
FIG. 16 illustrates a corresponding function in accordance with the invention with a full-line curve illustrating the FIG. 1 embodiment and with two broken-line curves illustrating the FIG. 6 embodiment.

FIG. 16 shows the orientation of said upper and lower windows for the signal-receiving circuit in more detail.

Figure 17:
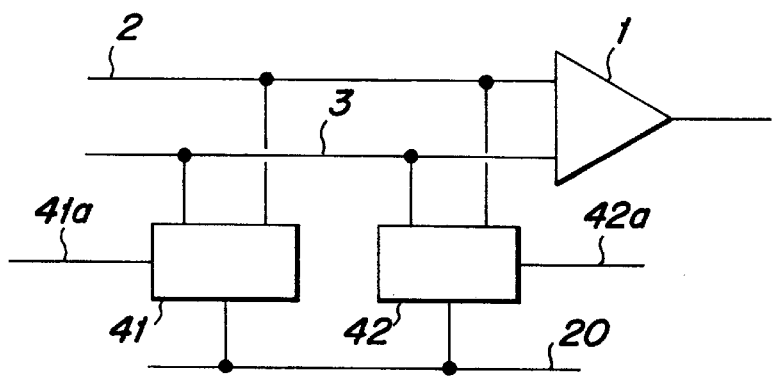
FIG. 17 illustrates the use of two terminating circuits that can be activated by an activating signal.

FIG. 17 is intended to illustrate two arrays of terminating circuits 41, 42 connected to the same conductors 2, 3. The terminating circuit 41 is assumed to consist of NMOS-transistors and the terminating circuit 42 is assumed to consist of PMOS-transistors.

When each terminating circuit includes NMOS-transistors and PMOS-transistors which are connected to one and the same connection with conductors 2, 3, it is possible to select one of the terminating circuits, such as circuit 41, and block the other terminating circuit 42 by activation through an external circuit via conductors 41a, 42a, so that one and the same receiving unit 1 is able to cover either a lower or an upper window.

These windows can be allowed to overlap one another, by appropriate selection of the voltage ranges 161, 162, in accordance with FIG. 16.

Each controllable terminating transistor may also be deactivated by a control signal, or by lowering the level of voltage on the conductor 9.

As earlier indicated in a number of applications, a higher voltage value may be required on the conductor 25 than that which can be afforded via the voltage on the conductor 9 with an addition of the voltage value on conductor 20. This higher voltage value is required for compensating for the body-effect and for the voltage reduction caused by the SC-technique and its parasitic capacitances in switches, capacitors and conducting circuits.

One coupling/technical alternative is described with reference to FIG. 7, which shows a circuit supplement to the embodiment of FIGS. 2 or 3, where the voltage values occurring, inter alia, on the gate connection 33g are slightly elevated via the conductor 24, to compensate for transistor-related body-effects and parasitic capacitances.

Figure 7:
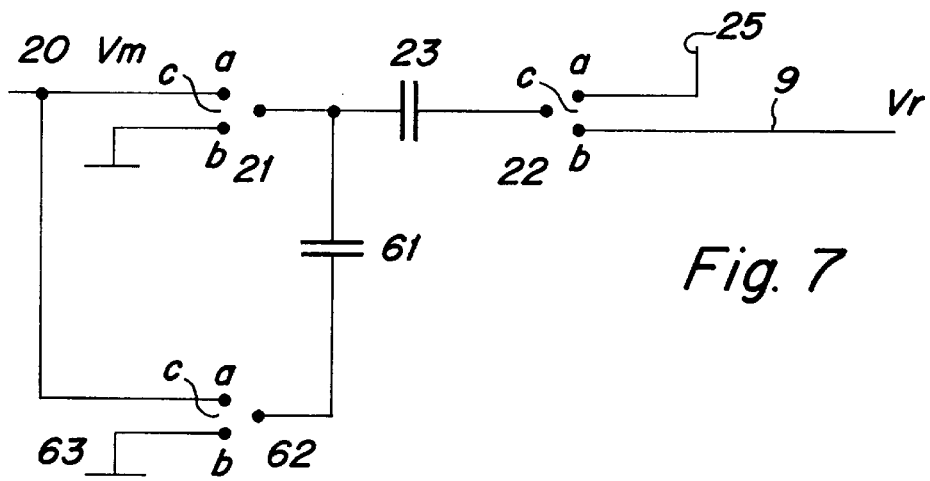
FIG. 7 illustrates part of a circuit arrangement which is supplementary to the embodiments of FIGS. 2 or 3, such as to provide a fourth circuit arrangement having elevated control voltage for compensating for body-effects and parasitic capacitances.

FIG. 7 illustrates the presence of a further capacitor 61, which is connected to the capacitor 23 and which can be activated and deactivated through the medium of a third switching device 62, so as to increase by a chosen factor the voltage generated by the voltage mean-value forming unit 5.

In the case of the FIG. 7 embodiment, the voltage value 20 is applied to the electrical contact position 62a of a further switching device 62, so that in this state of the switch, the voltage value 20 will be applied to the further capacitor 61 and the capacitor 23, and in another state 62b of said switch the further capacitor 61 will be connected to an earth-potential 63.

The level of voltage on the conductor 25 can herewith attain a theoretical level which corresponds to the voltage level on the conductor 9 added with twice the level of the voltage value 20.

Figure 8:
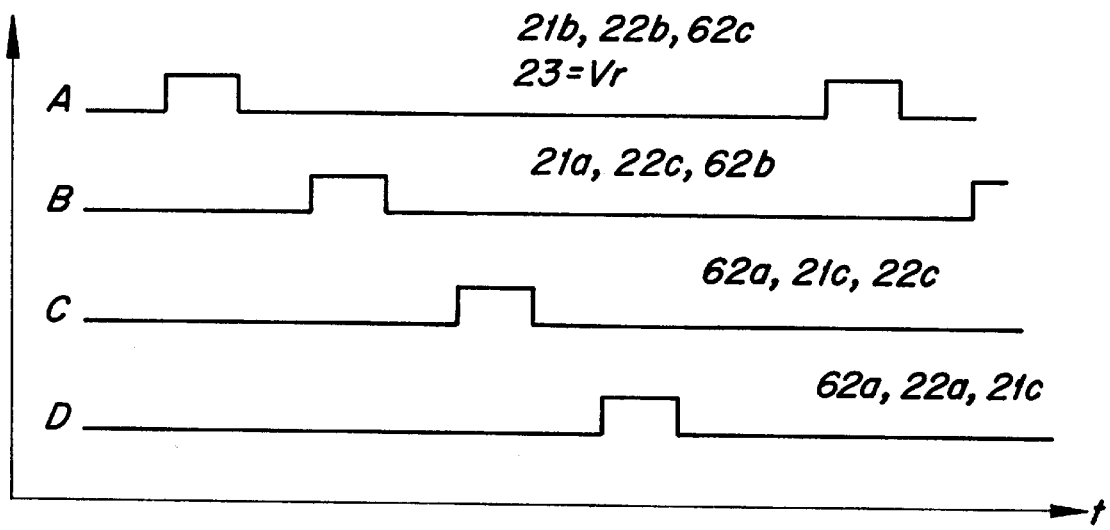
FIG. 8 is a time diagram which illustrates sequential activation of the electrical contact devices present in the switching circuits shown in FIGS. 3 and 7.

FIG. 8 illustrates a time diagram for activating the switching circuit or the first coupling device 21 and the second coupling device 22 paired with the third coupling device 62, so as to create conditions for obtaining said high level of control voltage.

As will be seen from FIG. 8A, activation of the switches 21, 22 to their respective states 21b and 22b, and setting of the switching device 62 to its state 62c, will result in the transmission of the voltage on conductor 9 to the capacitor 23 as a voltage "Vr".

As will be seen from FIG. 8B, subsequent activation of the switches to switching states 21a, 22c and 62b will cause the voltage on the conductor 20 to be transmitted to the capacitor 61 as a voltage value "Vm".

As will be seen from FIG. 8C, subsequent activation of the switches to respective states 21c, 22c and 62a will cause the voltage (Vm) on the conductor 20 to lie "in series" with the voltage "Vm" across the capacitor 61 and in series with the voltage "Vr" across the capacitor 23.

As will be seen from FIG. 8D, subsequent activation of the switches to respective states 62a, 22a and 21c causes a voltage value which corresponds theoretically to the voltage value (Vr+2Vm) to occur on the conductor 25 and on the gate-connection 33g.

In the case of the practical application, however, the value of the voltage on the gate connection will be slightly lower, although sufficient to achieve desired compensation for both body-effects and parasitic capacitances.

Figure 9:
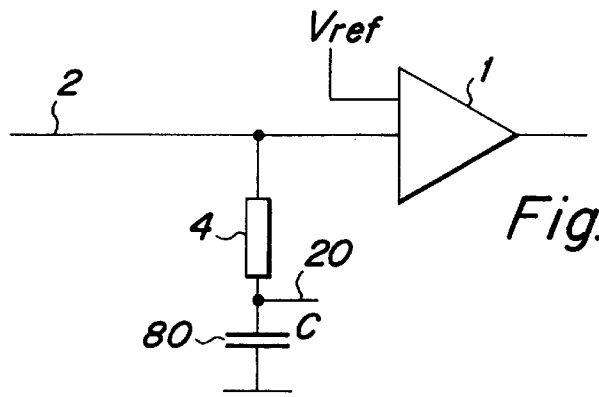
FIG. 9 illustrates single-ended signalling with a floating and deactivated termination.

FIG. 9 is a simplified circuit diagram which illustrates single-ended signalling with the terminating circuit being floating and connected to earth potential across a capacitance 80. The mean value can be said to occur at the connection point 20.

Figure 10:
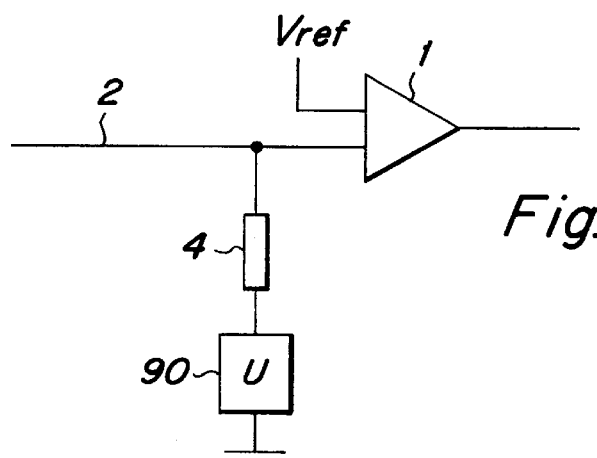
FIG. 10 illustrates single-ended signalling with a fixed termination in relation to a fixed voltage.

FIG. 10 shows a simplified circuit which illustrates single-ended signalling and which includes a conductor 2, a signal receiver 1 with the terminating circuit 4 fixedly related to a fixed-voltage generating circuit 90. In this case, the voltage may be any desired voltage and may even be a 0 voltage.

Figure 11:
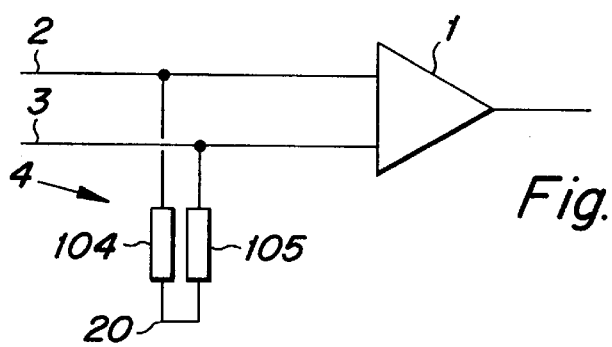
FIG. 11 illustrates differential signalling with a floating termination.

FIG. 11 illustrates schematically differential signalling with floating termination and with the impedances 104 and 105 of the terminating circuit 4 being connected in series over the conductors 2, 3.

Figure 12:
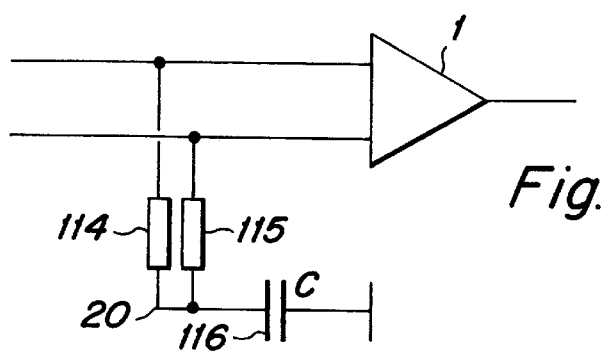
FIG. 12 illustrates differential signalling with a floating termination that is deactivated.

FIG. 12 illustrates schematically differential signalling with floating and deactivated termination. In this case, impedances 114 and 115 belonging to the terminating circuit 4 are connected in series, with the common connection point 20 connected to a capacitor 116 and to earth potential.

Figure 13:
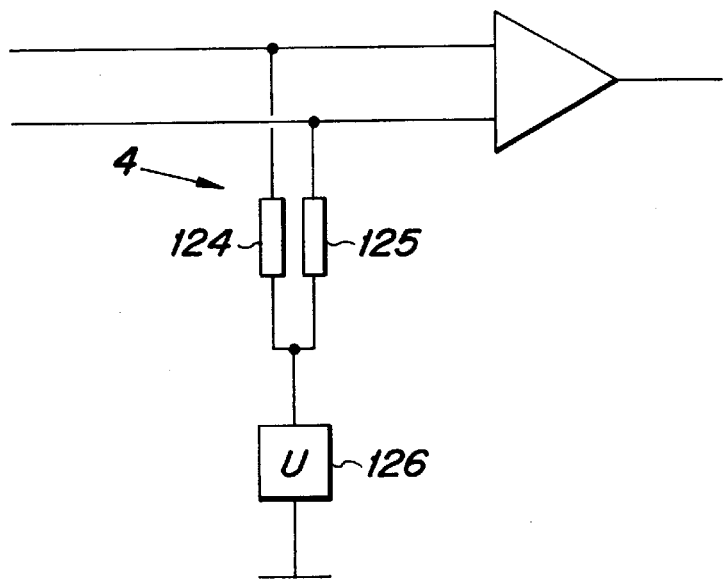
FIG. 13 illustrates differential signalling with fixed termination in relation a circuit which generates a fixed voltage.

FIG. 13 illustrates schematically differential signalling with the impedances 124, 125 of the terminating circuit 4 fixedly related to a fixed-voltage generating circuit 126. The voltage may have any desired value, and may even be 0.

FIG. 14 illustrates curves characteristic of an NMOS-transistor where the voltage values shall be chosen within the proportional or linear area A, so as to form resistance-dominated impedances.

Figure 15:
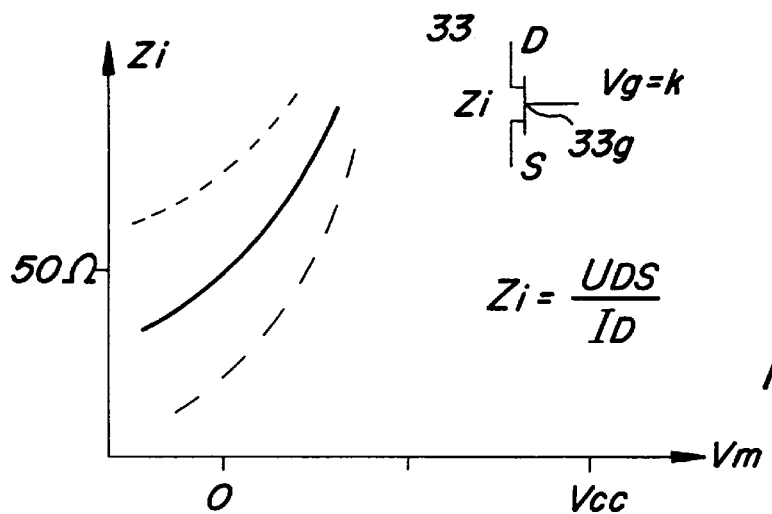
FIG. 15 illustrates the function of the impedance variation in respect of voltage variations and with a constant gate voltage in accordance with known conditions.

FIG. 15 illustrates changes in the impedance value in dependence on the voltage (Vm) at a constant voltage to the gate connection 33g of the transistor 33, in the absence of the voltage adjustment significant to the invention.

FIG. 15 is a graph which shows the variation in impedance between the drain and the source connections with respect to a small voltage in the order of some 100 mV.

FIG. 15 is also intended to illustrate what will happen to the impedance Zi when the drain and the source voltages are displaced upwards in parallel with a constant gate voltage.

The mean value Vm will therewith be (VD+VS)/2.

This shows a marked change in the impedance value in accordance with the variation in voltage, together with pronounced dispersion or deviation.

FIG. 16 illustrates a corresponding change with voltage compensation in accordance with the invention.

The impedance change at a gate voltage (Vr+Vm) in accordance with FIG. 1 is shown in a full line.

The impedance change at a gate voltage (Vr+kVm) is shown in a broken line, where k is 1.2.

The impedance change at a gate voltage 25 with an amplification factor higher than at k=1.2, is shown with a dotted line.

The range 161 is intended to illustrate the orientation of the voltage range for a "lower" window, while the region 162 is intended to illustrate the orientation of the voltage range for an "upper" window.

It will be noted that when the accompanying Figures show only one single transistor, this transistor can, in practice, consist of one or more series-connected and/or parallel-connected transistors, and also in combination with components, such as resistors, in accordance with the aforegoing.

It will be understood that the invention is not restricted to the described and illustrated exemplifying embodiments thereof and that modifications can be made within the scope of the inventive concept as defined in the following claims.

I claim:

1. A terminating circuit connected to a signal transmission medium including one or two conductors on which information-carrying signals are transmitted as voltage pulses, and an impedance-matching circuit connected to said conductor or conductors, comprising:

a mean voltage value-forming unit which generates a mean voltage value;

a control unit which generates an adapted reference voltage value; and an impedance-matching transistor which is included in said impedance-matching circuit, wherein said mean voltage value and said adapted reference voltage value are added together to form a composite control voltage value which is applied to a gate-connection of said impedance-matching transistor.

2. A circuit according to claim 1, wherein the composite control voltage value applied to said gate connection is generated by a voltage addition circuit to which there is applied said mean voltage value obtained from said mean voltage value forming unit and said adapted reference voltage value obtained from said control unit.

3. A circuit according to claim 1, wherein said mean voltage value forming unit is connected to one of said conductors and includes a signal integrating circuit.

4. A circuit according to claim 1, wherein the mean voltage value forming unit is connected to both conductors and includes two mutually similar components.

5. A circuit according to claim 1, wherein the mean voltage value generated by the mean voltage value forming unit is applied to the gate connection using SC-technology means.

6. A circuit according to claim 5, wherein the SC-technology means comprises:

a first switching circuit;

a second switching circuit; and a capacitance or capacitor connected between said first and second switching circuits.

7. A circuit according to claim 1, wherein said mean voltage value-forming unit comprises:

impedance-matching devices that are connected to said two conductors and coupled together to form a voltage equal to a mean value of said voltage pulses.

8. A circuit according to claim 6, wherein the mean voltage value formed by said mean voltage value forming unit is applied to said first switching circuit which in a first switched state delivers said mean voltage value to a capacitor belonging to said impedance matching circuit.

9. A circuit according to claim 8, wherein said second switching circuit is connected to said capacitor, wherein said second switching circuit in a first switched state applies a capacitor-associated voltage to said gate connection, and in a second switched state delivers said reference voltage value to said capacitor.

10. A circuit according to claim 8, wherein said first and said second switching circuits are coordinated by control signals so as to simultaneously take said first switched state or simultaneously take said second switched state.

11. A circuit according to claim 1, wherein the impedance-matching circuit comprises said impedance matching transistor connected between said two conductors; and a second transistor and a third transistor forming said mean voltage-value forming unit, wherein the gate-connections of all said transistors can be influenced by said composite control voltage value.

12. A circuit according to claim 1, wherein said impedance matching transistor is deactivated by a control signal.

13. A circuit according to claim 1, wherein termination afforded by the impedance-matching circuit is either floating, deactivated or related to a fixed voltage.

14. A circuit according to claim 1, wherein said mean voltage value generated by the mean voltage value-forming unit is amplified in an amplifier coupling.

15. A circuit according to claim 1, wherein the composite control voltage value is increased using SC-technology means.

16. A circuit according to claim 1, wherein the adapted reference voltage value is set to a voltage which is less than a selected system-related supply voltage.

17. A circuit according to claim 1, wherein the impedance matching transistor to which the gate voltage is delivered is maintained constant in relation to voltages occurring on the drain or source connections of said impedance matching transistor.

18. A circuit according to claim 1, wherein the mean voltage value forming unit comprises:

two series-connected transistors which are connected between said two conductors, wherein said mean voltage value is present at the common connection point of said two transistors.

19. A circuit according to claim 1, further comprising two series-connected transistors wherein the gate connections of said series connected transistors are connected directly to a gate connection of a further transistor.

20. A circuit according to claim 19, wherein the further transistor is parallel-coupled with said two series-connected transistors.

21. A circuit according to claim 1, further comprising means for compensating for a shift in a transistor-related working point and/or a shift in a terminating point relative to earth potential by providing voltage matching occurrent voltage values on the gate connection.

22. A circuit according to claim 15, wherein a control value applied to the gate connection of said impedance matching transistors is stored by said impedance matching transistor.

23. A circuit according to claim 1, wherein said composite control voltage value applied to the gate connection is acceptable within a range of from slightly beneath 0-level and up to slightly above half of a supply voltage when said impedance matching transistor includes NMOS-transistors.

24. A circuit according to claim 1, wherein said impedance-matching transistor is comprised of PMOS-elements.

25. A circuit according to claim 24, wherein the composite control voltage value applied to the gate connection is acceptable within a range of from slightly beneath half the supply voltage to slightly above a supply voltage.

26. A circuit according to claim 23, wherein NMOS-transistors and PMOS-transistors are combined in different terminating circuits so as to be able to cover a lower or an upper window selectively in response to an activating signal.

27. A circuit according to claim 1, wherein said mean voltage value is applied to a first switching circuit and a third switching circuit.

28. A circuit according to claim 27, wherein said first and said third switching circuits, and also a second switching circuit, can be caused to adopt one of three switching states in response to a control signal.

29. A circuit according to claim 27, wherein the mean voltage value is applied to a capacitor or capacitance when the first and the third switching circuits are in a first switching state.

30. A circuit according to claim 29, wherein said mean voltage value is applied to a further capacitance or a further capacitor by virtue of the third switching circuit being set to its second switching state.

31. A circuit according to claim 30, wherein said further capacitance is connected between the first switching circuit and the third switching circuit and said capacitance or capacitor.

32. A circuit according to claim 28, wherein said three switching circuits are influenced by activation signals so that in a first time section:
   a) the first switching circuit will adopt its second switching state;
   b) the second switching circuit will adopt its second switching state; and
   c) the third switching circuit will adopt its third switching state;
in a second following time section:
   a) the first switching circuit will adopt its first switching state;
   b) the second switching circuit will adopt its third switching state; and
   c) the third switching circuit will adopt its second switching state;
in a third following time section:
   a) the first switching circuit will adopt its third switching state;
   b) the second switching circuit will adopt its third switching state;
   c) the third switching circuit will adopt its first switching state; and
in a fourth following time section:
   a) the first switching circuit will adopt its third switching state;
   b) the second switching circuit will adopt its first switching state; and
   c) the third switching circuit will adopt its first switching state.

33. A circuit according to claim 27, wherein a further capacitor is connected to a capacitor and can be activated and deactivated time-wise to increase the composite control-voltage value that can be applied to the gate connection.

34. A circuit according to claim 7, wherein the mean voltage value formed by said mean voltage value forming unit is applied to said first switching circuit which in a first switched state delivers said mean voltage value to a capacitor belonging to said circuit.

35. A circuit according to claim 9, wherein said first and said second switching circuits are coordinated by control signals so as to simultaneously take said first switched state or simultaneously take said second switched state.

36. A circuit according to claim 14, wherein the composite control voltage value is increased using SC-technology means.

37. A circuit according to claim 7, wherein the mean voltage value forming unit comprises:
   two series-connected transistors which are connected between said two conductors, wherein said mean voltage value is present at the common connection point of said two transistors.

38. A circuit according to claim 11, wherein said second and third transistors are series-connected and wherein the gate connection of said second and third series-connected transistors are connected directly to a gate connection of said impedance matching transistor.

39. A circuit according to claim 17, further comprising two series-connected transistors wherein the gate connection of said series-connected transistors are connected directly to a gate connection of a further transistor.

40. A circuit according to claim 14, further comprising means for compensating for a shift in a transistor-related working point and/or a shift in a terminating point relative to earth potential by providing voltage matching occurrent voltage values on the gate connection.

41. A circuit according to claim 15, characterized in that a shift in a transistor-related working point and/or a shift in a terminating point relative to earth potential can be compensated for by voltage matching occurrent voltage values on the gate connection or the substrate gate.

42. A circuit according to claim 21, wherein a control value applied to the gate connection of said impedance matching transistor is stored by said impedance matching transistor.

43. A circuit according to claim 24, wherein NMOS-transistors and PMOS-transistors are combined in different terminating circuits so as to be able to cover a lower or an upper window selectively in response to an activating signal.

44. A circuit according to claim 15, wherein said mean voltage value is applied to a first switching circuit and a third switching circuit.

* * * * *